US010026869B2

United States Patent
Ueta et al.

(10) Patent No.: US 10,026,869 B2
(45) Date of Patent: Jul. 17, 2018

(54) NITRIDE SEMICONDUCTOR LIGHT-EMITTING DEVICE AND METHOD FOR PRODUCING THE SAME

(71) Applicant: Sharp Kabushiki Kaisha, Osaka-shi, Osaka (JP)

(72) Inventors: Yoshihiro Ueta, Osaka (JP); Shigetoshi Ito, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 80 days.

(21) Appl. No.: 15/140,703

(22) Filed: Apr. 28, 2016

(65) Prior Publication Data

US 2016/0343903 A1    Nov. 24, 2016

(30) Foreign Application Priority Data

May 20, 2015    (JP) .................................. 2015-102912

(51) Int. Cl.

| H01L 33/16 | (2010.01) |
|---|---|
| H01L 33/12 | (2010.01) |
| H01L 33/00 | (2010.01) |
| H01L 33/32 | (2010.01) |
| H01L 33/22 | (2010.01) |

(52) U.S. Cl.
CPC ............ *H01L 33/12* (2013.01); *H01L 33/007* (2013.01); *H01L 33/16* (2013.01); *H01L 33/32* (2013.01); *H01L 33/0079* (2013.01); *H01L 33/22* (2013.01)

(58) Field of Classification Search
CPC ....... H01L 33/12; H01L 33/16; H01L 33/005; H01L 33/0066; H01L 33/0007
See application file for complete search history.

(56) References Cited

U.S. PATENT DOCUMENTS

| 5,315,128 A * | 5/1994 | Hunt .......................... G01J 3/26 257/16 |
|---|---|---|
| 6,525,345 B1 | 2/2003 | Kadota |
| 2001/0009222 A1* | 7/2001 | Mizouchi .............. C23C 14/185 204/192.17 |
| 2001/0038655 A1* | 11/2001 | Tanaka ................... B82Y 20/00 372/43.01 |
| 2004/0227461 A1* | 11/2004 | Utsumi ................... H01L 33/22 313/506 |
| 2005/0056856 A1* | 3/2005 | Yamazaki ............... H01S 5/423 257/98 |
| 2005/0140291 A1* | 6/2005 | Hirakata ............. H01L 27/3211 313/512 |
| 2006/0029813 A1 | 2/2006 | Kutilek et al. |

(Continued)

FOREIGN PATENT DOCUMENTS

| CN | 1989079 A | 6/2007 |
|---|---|---|
| JP | 2000-58912 A | 2/2000 |
| JP | 2000-277435 A | 10/2000 |

*Primary Examiner* — Michele Fan
(74) *Attorney, Agent, or Firm* — Keating & Bennett, LLP

(57) ABSTRACT

A nitride semiconductor light-emitting device includes a substrate which includes polycrystal silicon dioxide or amorphous silicon dioxide as a main component, an underlying layer that is provided on the substrate, and a multilayer structure that is provided on the underlying layer and includes at least one layer made of a nitride semiconductor single crystal. The underlying layer includes crystals oriented to a c-axis and is formed by sputtering.

16 Claims, 4 Drawing Sheets

(56) References Cited

U.S. PATENT DOCUMENTS

| | | | |
|---|---|---|---|
| 2007/0020451 A1* | 1/2007 | Padiyath | B05D 7/546 428/336 |
| 2008/0185608 A1* | 8/2008 | Chitnis | H01L 33/0079 257/99 |
| 2009/0110017 A1* | 4/2009 | Aihara | H01L 33/0079 372/44.01 |
| 2009/0191654 A1* | 7/2009 | Yu | B29D 11/00634 438/29 |
| 2011/0122486 A1* | 5/2011 | Busch | C23C 16/26 359/359 |
| 2012/0222732 A1* | 9/2012 | Choi | H01L 33/007 136/255 |
| 2013/0099357 A1* | 4/2013 | Dargis | H01L 21/02381 257/615 |
| 2015/0077966 A1* | 3/2015 | Bessho | G02B 5/0242 362/19 |
| 2016/0240375 A1* | 8/2016 | Dargis | C30B 25/22 |

* cited by examiner

NITRIDE SEMICONDUCTOR LIGHT-EMITTING DEVICE AND METHOD FOR PRODUCING THE SAME

BACKGROUND

1. Field

The present disclosure relates to a nitride semiconductor light-emitting device and a method for producing the same.

2. Description of the Related Art

A nitride semiconductor made of GaN, InGaN, AlGaN, or the like is used as a material of a light-emitting diode (LED), a laser diode (LD), or the like. The nitride semiconductor is excellent in terms of heat resistance or environmental resistance, and therefore, is also applied to electronic devices.

Meanwhile, bulk crystal growth of the nitride semiconductor is not easy. Therefore, producing the nitride semiconductor substrate having practicable quality incurs an expense, and therefore, the nitride semiconductor substrate having practicable quality is very expensive. Therefore, as the growth substrate for a layer made of a nitride semiconductor single crystal (hereinafter, referred to as "the nitride semiconductor layer"), a single crystal sapphire substrate is widely put into practical use, and as a method for growing the nitride semiconductor layer, the following method is generally used. That is, a nitride semiconductor layer (for example, GaN layer) is epitaxially grown on the single crystal sapphire substrate by, for example, metalorganic vapor phase epitaxy (MOVPE).

In a case where the single crystal sapphire substrate is used as the growth substrate for the nitride semiconductor layer, a crystal defect, lattice strain, or the like due to a lattice constant difference between the nitride semiconductor and sapphire is generated. Therefore, in a case where the single crystal sapphire substrate is used as the growth substrate for the nitride semiconductor layer, the most general method for growing the nitride semiconductor layer is a method in which a low temperature growing buffer layer made of AlN, GaN, or the like is grown on the single crystal sapphire substrate at a low temperature of substantially 600° C., and then the desired nitride semiconductor layer is grown on the low temperature growing buffer layer at a high temperature of substantially 1000° C. or more (for example, refer to Japanese Unexamined Patent Application Publication No. 2000-277435). When the low temperature growing buffer layer is formed, the crystal defects are reduced, and the lattice strains are relaxed.

In the nitride semiconductor, atoms are strongly bonded to each other. Therefore, in order to improve the crystal quality of the nitride semiconductor layer, it is generally said that the nitride semiconductor layer is desirably grown at a high temperature of 1000° C. or more. An epitaxial growth of the nitride semiconductor layer is enabled by forming the low temperature growing buffer layer and growing the nitride semiconductor layer at a high temperature of 1000° C. or more and, as a result, an LED which is capable of emitting light from ultraviolet to green light, is widely put into practical use.

Light-emitting devices including the nitride semiconductor layer (nitride semiconductor light-emitting device), particularly, typical lighting LEDs or blue LEDs for backlighting, recently, have been widely used and costs thereof have been rapidly reduced. According to marketing research, price levels in 2020 are expected to be substantially ⅕ of the current price level.

Meanwhile, current element characteristics (for example, light-emitting efficiency, light-emitting intensity, light extraction efficiency, and the like) of the nitride semiconductor light-emitting device are expected to be maintained, or improved more. In addition, recently, an ultraviolet light-emitting device including the nitride semiconductor layer has been greatly expected to be used as a small and power-saving light source for sterilization, water purification, various medical fields, high-speed decomposition of pollutants, resin curing, or the like.

Accordingly, costs for producing the nitride semiconductor light-emitting device are desirably reduced while maintaining element characteristics of the nitride semiconductor light-emitting device or improving the characteristics more. In the single crystal sapphire substrate, which is used in general as the growth substrate for the nitride semiconductor layer, reduction of costs per area has progressed in the last few years. However, lifting the single crystal sapphire, or processing of the single crystal sapphire or the like incurs an expense, and extra cost reduction regarding the single crystal sapphire substrate is not easy. Japanese Unexamined Patent Application Publication No. 2000-58912, for example, proposes that a hexagonal crystal n-GaN thin film, or the like is formed on a Z plane of a Z-cut crystal substrate.

SUMMARY

It is desirable to provide a nitride semiconductor light-emitting device, in which element characteristics are maintained or improved more, at a low cost compared to a case in which the single crystal sapphire substrate is used as a growth substrate for the nitride semiconductor layer.

A nitride semiconductor light-emitting device according to an aspect of the disclosure includes a substrate including polycrystal silicon dioxide or amorphous silicon dioxide as a main component, an underlying layer on the substrate, and a multilayer structure on the underlying layer and including at least one layer made of a nitride semiconductor single crystal. The underlying layer includes crystals oriented to a c-axis and is formed by sputtering.

A nitride semiconductor light-emitting device according to another aspect of the disclosure includes a substrate including polycrystal silicon dioxide or amorphous silicon dioxide as a main component, an underlying layer on the substrate, and a multilayer structure on the underlying layer and including at least one layer made of a nitride semiconductor single crystal. The underlying layer includes crystals oriented to a c-axis and includes rare gas atoms of 10 atom % or less.

A method for producing a nitride semiconductor light-emitting device according to further aspect of the disclosure includes forming an underlying layer including crystals oriented to a c-axis on a substrate including polycrystal silicon dioxide or amorphous silicon dioxide as a main component by sputtering and forming a multilayer structure, which includes at least one layer made of a nitride semiconductor single crystal, on the underlying layer.

DESCRIPTION OF THE EMBODIMENTS

Figure 1:
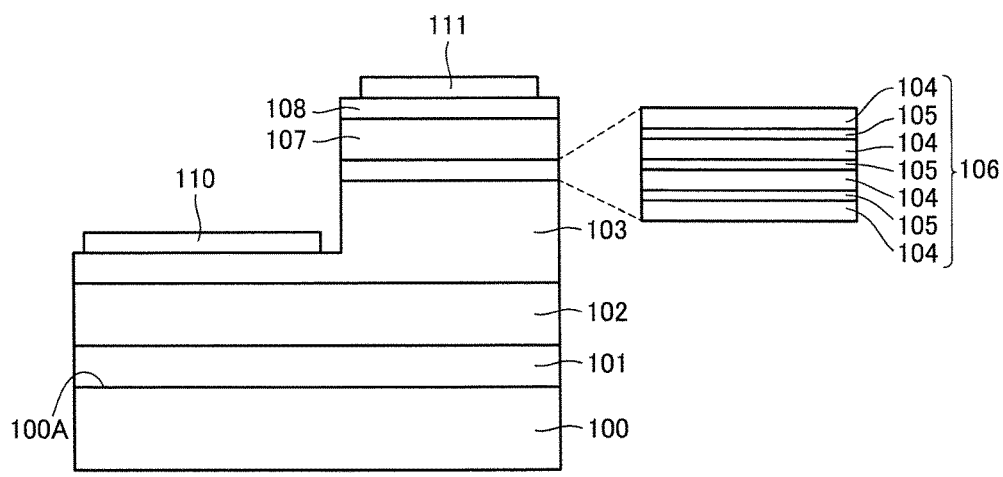
FIG. 1 is a sectional view of a nitride semiconductor light-emitting device of an embodiment of the disclosure.

As described above, costs for producing the nitride semiconductor light-emitting device are desirably reduced while maintaining current element characteristics of the nitride semiconductor light-emitting device or improving the characteristics more. However, it is not easy to further reduce the costs for producing a single crystal sapphire substrate. Therefore, if the single crystal sapphire substrate is continuously used as a growth substrate for the nitride semiconductor layer, the costs for producing the nitride semiconductor light-emitting device are not easily further reduced.

Regarding silicon dioxide, a technology for growing a large-diameter crystal by hydrothermal synthesis has been developed. In addition, a polycrystal material and an amorphous material can be provided at a cost lower than a single crystal material. Consequently, the inventors consider that, when a substrate, which includes polycrystal silicon dioxide or amorphous silicon dioxide as a main component, is used as a growth substrate for the nitride semiconductor layer, the costs for producing the nitride semiconductor light-emitting device can be reduced.

Here, the "single crystal" means that directions of an arrangement of the atoms are equal in any part of the crystal. Meanwhile, the "polycrystal" means that two or more single crystals are formed to be in contact with each other in irregular directions. Therefore, there are two or more plane orientations on a surface of the substrate including polycrystal silicon dioxide as a main component. In addition, the "amorphous" means that a crystal structure is not included. Therefore, no plane orientation exists at all on a surface of the substrate including amorphous silicon dioxide as a main component. Consequently, when the nitride semiconductor layer is grown in a state in which an underlying layer is stacked on a substrate including polycrystal silicon dioxide or amorphous silicon dioxide as a main component, the underlying layer having an excellent crystal quality is not easily obtained, and therefore, it is considered that a nitride semiconductor layer having an excellent crystal quality is not easily obtained. Actually, as the growth substrate for the nitride semiconductor layer, a single crystal substrate is used. In addition, when considering that the nitride semiconductor single crystal has a crystal structure of a hexagonal crystal, there is a case in which a Z-cut crystal substrate, or the like is used as a growth substrate for the nitride semiconductor layer (refer to, for example, Japanese Unexamined Patent Application Publication No. 2000-58912, or the like).

To summarize the above, in the related art, in order to grow the nitride semiconductor layer having an excellent crystal quality, that is, to improve the element characteristics of the nitride semiconductor light-emitting device, an expensive single crystal substrate is intentionally used as the growth substrate for the nitride semiconductor layer. Here, the inventors earnestly investigated a method which is capable of growing the nitride semiconductor layer having an excellent crystal quality, even when a substrate including polycrystal silicon dioxide or amorphous silicon dioxide as a main component is used as the growth substrate for the nitride semiconductor layer. As a result, when an underlying layer is formed on the substrate including polycrystal silicon dioxide or amorphous silicon dioxide as a main component by a predetermined sputtering method, it is found that the nitride semiconductor layer having an excellent crystal quality can be grown on the underlying layer.

Based on the above description, the nitride semiconductor light-emitting device of the disclosure is complete. Hereinafter, the disclosure will be described with reference to drawings. In the drawings of the disclosure, the same reference numerals are used to indicate the same parts or corresponding parts. In addition, dimensional relationships, such as lengths, widths, thicknesses, and depths, are appropriately changed for the sake of convenience and simplification of the drawings, and do not indicate actual dimensional relationships.

Hereinafter, in order to indicate a positional relationship, parts illustrated at a lower side of FIG. 1 to FIG. 4 are described as "under", and parts illustrated at an upper side of FIG. 1 to FIG. 4 are described as "up". This is description for the convenience, and these are different from the "up" and "under", which are set with respect to the direction of the gravity.

First Embodiment

Structure of Nitride Semiconductor Light-Emitting Device

FIG. 1 is a sectional view of a nitride semiconductor light-emitting device of a first embodiment of the disclosure. The nitride semiconductor light-emitting device of this embodiment includes a substrate 100, an underlying layer 101 provided on the substrate 100, and a multilayer structure provided on the underlying layer 101. The substrate 100 includes polycrystal silicon dioxide or amorphous silicon dioxide as a main component. The underlying layer 101 includes a crystal oriented to a c-axis, and is formed by sputtering. Alternatively, the underlying layer 101 includes the crystals oriented to the c-axis and 10 atom % or less of rare gas atoms. The multilayer structure includes at least one nitride semiconductor layer (layer made of a nitride semiconductor single crystal).

In this embodiment, the underlying layer 101, a buffer layer 102, and the multilayer structure are sequentially provided on the substrate 100, and in the multilayer structure, an n-type nitride semiconductor layer 103, a light-emitting layer 106, a carrier-barrier layer 107, and a p-type nitride semiconductor layer 108 are sequentially provided on the buffer layer 102. The multilayer structure is etched so as to expose the n-type nitride semiconductor layer 103, and an n-side electrode 110 is provided on the exposed surface of the n-type nitride semiconductor layer 103. In addition, a p-side electrode 111 is provided on the p-type nitride semiconductor layer 108.

Substrate

Polycrystal Silicon Dioxide or Amorphous Silicon Dioxide

The substrate 100 includes polycrystal silicon dioxide or amorphous silicon dioxide as a main component. Therefore, the costs for producing the substrate 100 can be reduced to be lower than the costs for producing the single crystal silicon dioxide substrate, and thus, the costs for producing the substrate 100 can be reduced to be lower than the costs for producing the single crystal sapphire substrate. Therefore, in this embodiment, compared to a case in which the single crystal sapphire substrate is used as the growth substrate for the nitride semiconductor layer, the costs for producing the growth substrate for the nitride semiconductor layer can be reduced, and thus, the costs for producing the nitride semiconductor light-emitting device can be reduced.

In this specification, the "substrate including polycrystal silicon dioxide or amorphous silicon dioxide as a main component" means that the substrate 100 includes 50 mass % or more of polycrystal silicon dioxide or amorphous silicon dioxide. The content of polycrystal silicon dioxide or amorphous silicon dioxide in the substrate 100 is preferably 70 mass % or more, and more preferably 90 mass % or more.

In this specification, Raman spectroscopy is used to confirm whether or not the material of the substrate 100 is silicon dioxide. In addition, the substrate 100 is processed to be a thin film using a focused ion beam (FIB) device so as to produce a measurement sample. Whether or not the substrate 100 includes polycrystal silicon dioxide or amorphous silicon dioxide is checked by observing a transmission electron microscope (TEM) image or a scanning transmission electron microscope (STEM) image of the produced measurement sample. When a weak spot of an electron beam diffraction image is observed in the TEM image or the STEM image, it can be said that polycrystal silicon dioxide is included in the substrate 100, and when a halo shape pattern is observed in a background of the electron beam diffraction image, it can be said that amorphous silicon dioxide is included in the substrate 100.

In addition, generally, in a Raman spectrum, a degree of a long range order of a molecular structure is reflected. Therefore, each shape of the Raman spectrum is apparently different in the single crystal silicon dioxide, the polycrystal silicon dioxide, and the amorphous silicon dioxide. Accordingly, the shape of the Raman spectrum, a peak intensity of a certain peak appearing in the Raman spectrum, a half-value width of a certain peak appearing in the Raman spectrum, a peak position (peak wavelength) of a certain peak appearing in the Raman spectrum, and the like are comprehensively analyzed, and accordingly, the content of polycrystal silicon dioxide or amorphous silicon dioxide in the substrate 100 is obtained.

First Atom

The substrate 100 may further include first atoms, other than silicon (Si) atoms and oxygen (O) atoms. Here, when the first atoms are included in the substrate 100, the refractive index of the substrate 100 becomes high compared to a refractive index of a substrate which only includes silicon dioxide. That is, the first atoms are added to the substrate 100, and thus the refractive index of the substrate 100 can be improved. Accordingly, a light extraction efficiency of the nitride semiconductor light-emitting device can be further improved. Here, the "substrate made of only silicon dioxide" is a substrate made of polycrystal silicon dioxide or amorphous silicon dioxide, and it means a substrate which does not further include atoms different from Si atoms and O atoms.

In detail, as the nitride semiconductor constituting the nitride semiconductor light-emitting device, GaN, AlN, InN, or the like is known. Regarding refractive indices of these elements, the refractive index of GaN is 2.54, the refractive index of AlN is 2.2, and the refractive index of InN is 3.5. A refractive index of a mixed crystal of them, corresponding to a composition of the mixed crystal, indicates a value within the refractive index of the nitride semiconductor included in the mixed crystal. Therefore, in any case, a refractive index difference between the nitride semiconductor and atmosphere is 1.2 (=2.2−1) or more, and thus, the light extraction efficiency of the nitride semiconductor light-emitting device is not easily improved.

However, the refractive index of silicon dioxide is substantially 1.5. Therefore, when the substrate 100 is used as the growth substrate for the nitride semiconductor layer, the refractive index difference between the nitride semiconductor layer and the substrate 100 is 0.7 (=2.2−1.5) or more, the refractive index difference between the substrate 100 and atmosphere is substantially 0.5 (=1.5−1). With such addition of the first atoms, the refractive index of the substrate 100 becomes high, and thus the refractive index difference between the nitride semiconductor layer and the substrate 100 becomes small. Accordingly, in a surface 100A of the substrate 100 positioned on the underlying layer 101 side (hereinafter, the "surface of the substrate positioned on the underlying layer side" is referred to as an "upper surface of the substrate"), a light reflectance generated in the light-emitting layer 106 can be reduced (Snell's law). Accordingly, if the substrate 100 includes not only Si atoms and O atoms but also the first atoms, the light extraction efficiency of the nitride semiconductor light-emitting device can be improved, compared to the substrate made of only silicon dioxide.

Preferably, the first atoms are at least one of lanthanum (La) atoms and titanium (Ti) atoms, and the number thereof included in the substrate 100 is $1 \times 10^{10}$ cm$^{-3}$ or more and $1 \times 10^{12}$ cm$^{-3}$ or less. For example, if the substrate 100 includes not only Si atoms and O atoms but also $1 \times 10^{10}$ cm$^{-3}$ or more and $1 \times 10^{12}$ cm$^{-3}$ or less of La atoms, the refractive index of such a substrate 100 increases substantially 0.1 to 0.15 compared to the refractive index of the substrate made of only silicon dioxide. If the substrate 100 includes not only Si atoms and O atoms but also $1 \times 10^{10}$ cm$^{-3}$ or more and $1 \times 10^{12}$ cm$^{-3}$ or less of Ti atoms, the refractive index of such a substrate 100 increases substantially 0.03 to 0.05 compared to the refractive index of the substrate made of only silicon dioxide.

In addition, the inventors have confirmed that, if the concentration of the first atoms in the substrate 100 is $1 \times 10^{12}$ cm$^{-3}$ or less, an amount of light generated in the light-emitting layer 106 and absorbed in the first atoms can be reduced. In this way, since a light extraction amount of the nitride semiconductor light-emitting device can be secured, the light extraction efficiency of the nitride semiconductor light-emitting device can be maintained at a high level. More preferably, the number of the first atoms included in the substrate 100 is $1 \times 10^{10}$ cm$^{-3}$ or more and $5 \times 10^{11}$ cm$^{-3}$ or less.

In this specification, a type and concentration of the first atoms included in the substrate 100 are calculated by using wavelength-dispersive total reflection X-Ray fluorescence (WD-TXRF). Positions of the first atoms in the substrate 100 are not specifically limited. In a case where the substrate 100 includes polycrystal silicon dioxide as a main component, the first atoms may be provided between single crystal silicon dioxides adjacent to each other, or may be provided to be scattered in the substrate 100. In a case where the substrate 100 includes amorphous silicon dioxide as a main component, the first atoms may be scattered in the substrate 100.

Hitherto, the substrate 100 has been described. Since the substrate 100 includes polycrystal silicon dioxide or amorphous silicon dioxide as a main component, the substrate 100 has a high transmittance with respect to not only visible light but also ultraviolet and deep ultraviolet. The "visible light" means an electromagnetic wave of which a wavelength is 360 nm or more and 830 nm or less, the "ultraviolet" means an electromagnetic wave of which a wavelength is more than 320 nm and less than 360 nm, and the "deep ultraviolet" means an electromagnetic wave of which a wavelength is 200 nm or more and 320 nm or less. Therefore, an ultraviolet light-emitting device or a deep ultraviolet light-emitting device can be provided using the substrate 100. This means that the substrate 100 can be used instead of the single crystal sapphire substrate. A thickness of such a substrate 100 is preferably 200 μm or more and 1500 μm or less.

Underlying Layer

As described above, the underlying layer 101 may be formed by sputtering. Therefore, even when the substrate 100 is used as the growth substrate for the nitride semiconductor layer, the nitride semiconductor layer having an excellent crystal quality can be grown on the underlying layer 101. Reasons why such an effect is obtained are considered to be described herein below.

In sputtering, electrons or ions generated by ionization of inert gas collide with a target at a high speed, and heavy atoms or molecules constituting the target are beaten out from the target (sputtering phenomenon). The ionized heavy atoms or molecules by the sputtering phenomenon reach a film forming surface (in this embodiment, an upper surface 100A of the substrate 100) in a state of having a large amount of kinetic energy, and are attached to the film-forming surface. In this way, a film is formed on the film forming surface.

As described above, "sputtering" is a method for physically forming a film on the film forming surface without causing a chemical reaction, a phase change in the film forming surface, or the like. Therefore, any substrate may be used as the substrate 100. That is, the substrate, which is not capable of being used in a case where a film is chemically formed (for example, a film is formed by chemical vapor deposition (CVD), or the like), can be used as the growth substrate for the nitride semiconductor layer. Accordingly, even when the substrate 100 is used as the growth substrate for the nitride semiconductor layer, the underlying layer 101 can be formed without taking over the crystal quality, or the like of the substrate 100.

In addition, in sputtering, a film is physically formed on the film forming surface, and thus the film can be formed in a state in which original properties of a material of a target are maintained. Besides, even when a material having a high melting point is used as the material of the target, the film can be formed in a state of maintaining composition of the material of the target. For example, a material having ionic bonding has a characteristic of easily orienting to the c-axis, and has a high melting point. Therefore, when a target made of a material having ionic bonding is used as the target for forming the underlying layer 101, the underlying layer 101 can be formed in a state in which a characteristic of easily orienting to the c-axis and composition of the material of the target are maintained. Accordingly, the formed underlying layer 101 is the crystals oriented to the c-axis and includes crystals constituting the composition of the material of the target. Therefore, the underlying layer 101 having an excellent crystal quality can be formed. Additionally, the target made of the material having ionic bonding is available at a low cost, and thus the underlying layer 101 can be provided at a low cost. In addition, in sputtering, a film is physically formed on the film forming surface, and thus a film formation condition may be desirably set or changed without a progress of chemical reaction in consideration. In this way, the underlying layer 101 having an excellent crystal quality can be easily formed at a low cost.

Further, in sputtering, the ionized heavy atoms or molecules reach the film forming surface in a state of having the large kinetic energy, and thus are attached to the film forming surface with a large attachment force. Accordingly, at least a part of the formed underlying layer 101 can be inhibited from being separated from the upper surface 100A of the substrate 100, and thus the underlying layer 101 without forming a through hole (for example, through hole in micro pipe shape) can be formed.

Hitherto, even when the substrate 100 is used as the growth substrate for the nitride semiconductor layer, when the underlying layer 101 is formed on the upper surface 100A of the substrate 100 by sputtering using the target made of the material having ionic bonding, the underlying layer 101 having an excellent crystal quality without forming the through hole can be formed on the upper surface 100A of the substrate 100 at a low cost. In this way, the upper surface 100A of the substrate 100 is coated with the underlying layer 101 having an excellent crystal quality. Accordingly, since the nitride semiconductor layer can be formed on the underlying layer 101 without taking over the crystal quality of the substrate 100, the nitride semiconductor layer having an excellent crystal quality can be formed. Therefore, compared to a case in which the single crystal sapphire substrate is used as the growth substrate for the nitride semiconductor layer, the nitride semiconductor light-emitting device in which current characteristics thereof are maintained or are improved more, can be provided at a low cost.

As a material having ionic bonding, for example, AlN, BN, $Ga_2O_3$, or the like is exemplified. Therefore, at least one of an AlN crystal oriented to the c-axis, a BN crystal oriented to the c-axis, and a $Ga_2O_3$ crystal oriented to the c-axis is preferably included in the underlying layer 101 as the crystals oriented to the c-axis. When an X-ray diffraction spectrum of the underlying layer 101 is measured, a material of the crystals oriented to the c-axis can be checked.

More preferably, separately from the crystals oriented to the c-axis, 10 atom % or less of oxygen atoms are further included in the underlying layer 101. Thus, a c-axis orientation of the crystal (for example, AlN crystal, BN crystal, $Ga_2O_3$ crystal, or the like) included in the underlying layer 101 can be maintained at a high level. Accordingly, compared to a case in which the single crystal sapphire substrate is used as the growth substrate for the nitride semiconductor layer, the nitride semiconductor light-emitting device in which the element characteristics are further improved can be provided at a low cost. Still more preferably, separately from the crystals oriented to the c-axis, 3 atom % or more and 8 atom % or less of oxygen atoms are further included in the underlying layer 101. In this specification, "10 atom % or less of oxygen atoms are further included in the underlying layer, separately from the crystals oriented to the c-axis" means that such oxygen atoms do not consist of a crystal structure of the crystals oriented to the c-axis. In this specification, concentration of oxygen atoms in the underlying layer 101 can be calculated by a secondary ion mass spectrometry (SIMS).

As described above, when the underlying layer 101 is formed by sputtering using the target made of the material having ionic bonding, the underlying layer 101 including crystals constituting a composition of the material of the target which is the crystals oriented to the c-axis can be formed. Therefore, in this specification, "the underlying layer includes the crystals oriented to the c-axis" means that the underlying layer 101 is formed by sputtering using the target made of the material having ionic bonding.

In addition, "the crystals oriented to the c-axis" means that the crystals are integrated so that a c plane ((001) plane) of the crystals is in parallel to the upper surface 100A of the substrate 100. When a half-value width of an X-ray rocking curve of a plane (0002) of the underlying layer 101 is 1000 seconds or less and a half-value width of an X-ray rocking curve of a plane (1-102) of the underlying layer 101 is 1000 seconds or less, crystals contained in the underlying layer 101 are oriented to the c-axis.

Moreover, as described above, in sputtering, since a film forming process is performed in an atmosphere of inert gas, a film is formed by trapping the inert gas. Therefore, in this specification, "the underlying layer is formed by sputtering" can be changed into "10 atom % or less of rare gas atoms are included in the underlying layer", and preferably "3 atom % or more and 8 atom % or less of rare gas atoms are included in the underlying layer". In this specification, the concentration of rare gas atoms in the underlying layer 101 is calculated by SIMS. Generally, as the inert gas, rare gas such as argon (Ar), krypton (Kr), or xenon (Xe) is used.

Hitherto, the underlying layer 101 is described. The thickness of the underlying layer 101 is preferably 500 nm or more. With the thickness, since the upper surface 100A of the substrate 100 is totally coated with the underlying layer 101, the crystal quality of the nitride semiconductor layer formed on the underlying layer 101 can be further improved. More preferably, the thickness of the underlying layer 101 is 500 nm or more and 2000 nm or less.

Buffer Layer

When the buffer layer 102 is provided between the underlying layer 101 and the multilayer structure, the crystal quality of the nitride semiconductor layer included in the multilayer structure can be further improved. Thus, the element characteristics of the nitride semiconductor light-emitting device can be further improved. Accordingly, compared to a case in which the single crystal sapphire substrate is used as the growth substrate for the nitride semiconductor layer, the nitride semiconductor light-emitting device in which the element characteristics are further improved can be provided at a low cost.

The buffer layer 102 may be made of AlGaN, but is preferably made of AlN. When the buffer layer 102 is made of AlN, cracks, which are caused by lattice mismatch between a material of the underlying layer 101 and a material of the nitride semiconductor layer included in the multilayer structure, can be inhibited from being generated. In detail, even in any one of the compositions of the nitride semiconductor considered to be used constituting the nitride semiconductor layer included in the multilayer structure, the buffer layer 102 applies compression stress to the underlying layer 101. Accordingly, the cracks described above can be inhibited from being generated.

The thickness of such a buffer layer 102 is preferably 2 μm or more and 6 μm or less. With such thickness, the crystal quality of the nitride semiconductor layer included in the multilayer structure can be further improved. Particularly, when the thickness of the buffer layer 102 is 6 μm or less, the buffer layer 102 can be inhibited from having a negative influence on the crystal quality of the nitride semiconductor layer.

Multilayer Structure

N-Type Nitride Semiconductor Layer

The nitride semiconductor constituting the n-type nitride semiconductor layer 103 is preferably GaN, AlGaN, InGaN, or InAlGaN, and may be a mixed crystal made of at least two of these. It is preferable that the composition of the nitride semiconductor constituting the n-type nitride semiconductor layer 103 is determined in accordance with the light-emitting wavelength demanded by the nitride semiconductor light-emitting device. With such configuration, light generated in the light-emitting layer 106 can be inhibited from being absorbed in the n-type nitride semiconductor layer 103. Accordingly, since a light extraction amount from the nitride semiconductor light-emitting device can be secured, the light extraction efficiency of the nitride semiconductor light-emitting device can be maintained at a high level.

For example, when the nitride semiconductor constituting the n-type nitride semiconductor layer 103 is $Al_{x1}Ga_{1-x1}N$ ($0.7 \leq x1 \leq 1$), light generated in the light-emitting layer 106 (for example, deep ultraviolet) can be inhibited from being absorbed in the n-type nitride semiconductor layer 103. When the nitride semiconductor constituting the n-type nitride semiconductor layer 103 is $Al_{x2}Ga_{1-x2}N$ ($0.5 \leq x2 \leq 1$), the light generated in the light-emitting layer 106 (for example, ultraviolet) can be inhibited from being absorbed in the n-type nitride semiconductor layer 103. When the nitride semiconductor constituting the n-type nitride semiconductor layer 103 is $In_{x3}Ga_{1-x3}N$ ($0 \leq x3 \leq 0.05$), the light generated in the light-emitting layer 106 (for example, visible light) can be inhibited from being absorbed in the n-type nitride semiconductor layer 103.

Concentration of an n-type impurity in the n-type nitride semiconductor layer 103 is preferably $1 \times 10^{16}$ cm$^{-3}$ or more and $8 \times 10^{18}$ cm$^{-3}$ or less, and more preferably $1 \times 10^{16}$ cm$^{-3}$ or more and $1 \times 10^{18}$ cm$^{-3}$ or less. The concentration of the n-type impurity in the n-type nitride semiconductor layer 103 may be determined in accordance with the element characteristics demanded by the nitride semiconductor light-emitting device. The n-type impurity may be any one of Si, Se, and Ge; and preferably Si.

A thickness of the n-type nitride semiconductor layer 103 is preferably 1 μm or more and 4 μm or less. The n-type nitride semiconductor layer 103 may be configured to have two or more layers in which at least one of the composition of the nitride semiconductor and the concentration and thickness of the n-type impurity is different from the other.

Light-Emitting Layer

It is preferable that the light-emitting layer 106 has a configuration in which a well layer 105 is provided between the barrier layers 104. The composition of the nitride semiconductor constituting the barrier layer 104, a thickness of the barrier layer 104, the composition of the nitride semiconductor constituting the well layer 105, or, a thickness of the well layer 105 may be determined in accordance with the light-emitting wavelength or the element characteristics, or the like demanded by the nitride semiconductor light-emitting device. In addition, the thickness of the barrier layer 104 and the thickness of the well layer 105 may be determined by further considering formation of a quantum level of the light-emitting layer 106.

For example, in the nitride semiconductor light-emitting device which causes the generation of deep ultraviolet, the well layer 105 preferably includes Al, and more preferably is made of $Al_{s1}Ga_{1-s1}N$ ($0.4 \leq s1 \leq 0.6$). In the nitride semiconductor light-emitting device which causes the generation of ultraviolet, the well layer 105 preferably includes Al, and more preferably is made of $Al_{s2}Ga_{1-s2}N$ ($0.05 \leq s2 \leq 0.3$). In the nitride semiconductor light-emitting device which causes the generation of visible light, the well layer 105 preferably includes In, and more preferably made of $In_{s3}Ga_{1-s3}N$ ($0.08 \leq s3 \leq 0.7$).

In addition, the barrier layer 104 preferably has a bandgap energy which is higher than that of the well layer 105, so that the light generated in the light-emitting layer 106 is not absorbed therein. For example, in the nitride semiconductor light-emitting device generating deep ultraviolet, the Al composition of the nitride semiconductor constituting the barrier layer 104 is preferably higher than the Al composition of the nitride semiconductor constituting the well layer 105. For example, the barrier layer 104 may be made of $Al_{t1}Ga_{1-t1}N$ ($0.45 \leq t1 \leq 0.65$). As described above, in the nitride semiconductor light-emitting device generating deep ultraviolet, the Al composition of the nitride semiconductor respectively constituting the barrier layer 104 and the well layer 105 increases, and thus an electron hole (electron hole has a greater effective mass) is not easily injected to the light-emitting layer 106 (particularly, well layer 105) from the p-type nitride semiconductor layer 108. Therefore, when the thickness of the barrier layer 104 increases, the electron hole is not easily injected to the well layer 105. In addition, when the thickness of the well layer 105 increases, the electron hole is not easily injected to the well layer 105 positioned at the center in a thickness direction of the light-emitting layer 106. Accordingly, the thickness of the barrier layer 104 is preferably 5 nm or less, and more preferably, 1 nm or more and 5 nm or less. In addition, the thickness of the well layer 105 is preferably 5 nm or less, and more preferably, 1 nm or more and 5 nm or less.

In addition, in the nitride semiconductor light-emitting device generating ultraviolet, the Al composition of the nitride semiconductor constituting the barrier layer 104 is preferably higher than the Al composition of the nitride semiconductor constituting the well layer 105. For example, the barrier layer 104 may be made of $Al_{t2}Ga_{1-t2}N$ ($0.08 \leq t2 \leq 0.35$). In this case, the thickness of the barrier layer 104 is preferably 5 nm or less, and more preferably, 1 nm or more and 5 nm or less. In addition, the thickness of the well layer 105 is preferably 5 nm or less, and more preferably, 1 nm or more and 5 nm or less.

In addition, in the nitride semiconductor light-emitting device generating visible light, the In composition of the nitride semiconductor constituting the barrier layer 104 is preferably lower than the In composition of the nitride semiconductor constituting the well layer 105. For example, the barrier layer 104 may be made of $In_{t3}Ga_{1-t3}N$ ($0.05 \leq t3 \leq 0.65$). In this case, the thickness of the barrier layer 104 is preferably 5 nm or less, and more preferably, 1 nm or more and 5 nm or less. In addition, the thickness of the well layer 105 is preferably 5 nm or less, and more preferably, 1 nm or more and 5 nm or less.

As long as injection efficiency of the electron hole to the light-emitting layer 106 (particularly, well layer 105) from the p-type nitride semiconductor layer 108 can be maintained, the number of layers of the barrier layer 104 in the light-emitting layer 106 is not limited, and the number of layers of the well layer 105 in the light-emitting layer 106 is not limited, as well.

Carrier-Barrier Layer

The carrier-barrier layer 107 means a layer which has a function of inhibiting electrons, which are injected to the light-emitting layer 106, from over-flowing to the p-type nitride semiconductor layer 108 side. Therefore, the Al composition of the nitride semiconductor constituting the carrier-barrier layer 107 may be higher than the Al composition of the nitride semiconductor respectively constituting the barrier layer 104 and the well layer 105. In addition, the carrier-barrier layer 107 may have a thickness equal to or more than a minimum thickness which is capable of exerting the above described function.

Meanwhile, when a thickness of a layer having high Al composition of the nitride semiconductor increases, series resistance increases in the nitride semiconductor light-emitting device, and accordingly, power conversion efficiency of the nitride semiconductor light-emitting device is caused to be deteriorated. In addition, if the thickness of the carrier-barrier layer 107 increases, the electron hole is not easily injected to the light-emitting layer 106 (particularly, the well layer 105) from the p-type nitride semiconductor layer 108.

Based on the above description, the composition of the nitride semiconductor constituting the carrier-barrier layer 107 and a thickness of the carrier-barrier layer 107 may be determined. For example, the carrier-barrier layer 107 is preferably made of $Al_{u1}Ga_{1-u1}N$ ($0.7 \leq u1 \leq 0.9$), and more preferably made of $Al_{u1}Ga_{1-u1}N$ ($0.75 \leq u1 \leq 0.9$). In addition, the thickness of the carrier-barrier layer 107 is preferably 10 nm or more and 200 nm or less, and more preferably, 30 nm or more and 200 nm or less.

The carrier-barrier layer 107 may include a p-type impurity. By including such impurity, the series resistance of the nitride semiconductor light-emitting device can be reduced. As the p-type impurity, Mg can be used.

P-Type Nitride Semiconductor Layer

The nitride semiconductor constituting the p-type nitride semiconductor layer 108 may similar to the nitride semiconductor constituting the n-type nitride semiconductor layer 103. For example, if the nitride semiconductor constituting the p-type nitride semiconductor layer 108 is $Al_{y1}Ga_{1-y1}N$ ($0.7 \leq y1 \leq 1$), the light generated in the light-emitting layer 106 (for example, deep ultraviolet) can be inhibited from being absorbed in the p-type nitride semiconductor layer 108. In addition, if the nitride semiconductor constituting the p-type nitride semiconductor layer 108 is $Al_{y2}Ga_{1-y2}N$ ($0.5 \leq y2 \leq 1$), the light generated in the light-emitting layer 106 (for example, ultraviolet) can be inhibited from being absorbed in the p-type nitride semiconductor layer 108. In addition, if the nitride semiconductor constituting the p-type nitride semiconductor layer 108 is $In_{y3}Ga_{1-y3}N$ ($0 \leq y3 \leq 0.05$), the light generated in the light-emitting layer 106 (for example, visible light) can be inhibited from being absorbed in the p-type nitride semiconductor layer 108.

Concentration of the p-type impurity in the p-type nitride semiconductor layer 108 may be $1 \times 10^{18}$ cm$^{-3}$ or more and $1 \times 10^{20}$ cm$^{-3}$ or less. The concentration of the p-type impurity in the p-type nitride semiconductor layer 108 may be determined in accordance with the element characteristics demanded by the nitride semiconductor light-emitting device. For example, if the concentration of the p-type impurity in the p-type nitride semiconductor layer 108 is high, the series resistance of the nitride semiconductor light-emitting device can be reduced.

The thickness of such p-type nitride semiconductor layer 108 is preferably 0.05 μm or more and 1.5 μm or less, and more preferably, 0.5 μm or more and 1.5 μm or less. The p-type nitride semiconductor layer 108 may include a first p-type nitride semiconductor layer provided on the carrier-barrier layer 107 and a second p-type nitride semiconductor layer, which is provided on the first p-type nitride semiconductor layer and has a concentration of the p-type impurity higher than that of the first p-type nitride semiconductor layer. With such configuration, the series resistance of the nitride semiconductor light-emitting device can be further reduced.

N-Side Electrode and P-Side Electrode

Typical materials may be used, without being limited to a specific material, as a material of a contact electrode with respect to the n-type nitride semiconductor layer, and as a material of the n-side electrode 110, for example, Ni/Au can be used. Without being particularly limited to a specific material, and typical materials may be used as a material of a contact electrode with respect to the p-type nitride semiconductor layer, and as a material of the p-side electrode 111, for example, Pd/Au can be used.

The thickness of the n-side electrode 110 may be a thickness in general as a thickness of the contact electrode with respect to the n-type nitride semiconductor layer without being limited to a specific thickness, but it is preferably 1 µm or more. With such thickness, wire bonding can be performed on the n-side electrode 110. Similar description may be applied to a thickness of the p-side electrode 111.

Producing Nitride Semiconductor Light-Emitting Device

In a method for producing the nitride semiconductor light-emitting device to be described hereinafter, a wafer for forming the nitride semiconductor light-emitting device (hereinafter, simply referred to as "wafer") is divided into chips, and thereby the nitride semiconductor light-emitting device of this embodiment is obtained. Hereinafter, numerals of components corresponding to those of the nitride semiconductor light-emitting device are given to components of the wafer, and the method for producing the nitride semiconductor light-emitting device will be described. Materials and thicknesses, for example, of the components of the wafer are the same as those of the above-described "Structure of Nitride Semiconductor Light-emitting device".

Formation of Underlying Layer

In a process of forming the underlying layer 101, the underlying layer 101 including the crystals oriented to the c-axis is formed on the substrate 100 by sputtering.

For example, first, the substrate 100 is provided at a predetermined position inside a sputtering apparatus, and a target is provided at a predetermined position inside the sputtering apparatus. The substrate 100 is provided in the sputtering apparatus so that the upper surface 100A of the substrate 100 faces the target.

As the substrate 100 provided in the sputtering apparatus, the substrate 100 having the diameter of two inches (50.8 mm) or more is preferably used, and the substrate 100 having the diameter of four inches (101.6 mm) or more is more preferably used. When the substrate 100 having the diameter of four inches or more is used, a cost per unit area can be reduced, compared to the substrate 100 having the diameter of two inches or more. Accordingly, if the substrate 100 having the diameter of four inches (101.6 mm) or more is used, the costs for producing the nitride semiconductor light-emitting device can be further reduced.

In addition, as the substrate 100 provided in the sputtering apparatus, the substrate 100, which is cleaned with pure water after being cleaned with an organic solvent, may be used. With two times of cleaning, an organic material, a fine particulate material, or the like can be removed from the surface of the substrate 100. Accordingly, the substrate 100 in which the organic material, the fine particulate material, or the like is not attached to the surface thereof can be used as the growth substrate for the nitride semiconductor layer. Here, as the organic solvent, the organic solvent which is generally used as a cleaning solvent can be used.

As the target provided in the sputtering apparatus, a target made of a single crystal material may be used, but a target made of a polycrystal material is preferably used. By using such target, since costs for forming the underlying layer 101 can be reduced, the costs for producing the nitride semiconductor light-emitting device can be reduced.

As the sputtering apparatus, a sputtering apparatus which is generally used for producing the nitride semiconductor light-emitting device can be used without being particularly limited.

Next, after vacuuming the inside of the sputtering apparatus, inert gas is introduced into the sputtering apparatus, and a high frequency voltage is applied between the substrate 100 and the target. Thus, high frequency discharging occurs in the sputtering apparatus and a sputtering phenomenon occurs. Accordingly, the underlying layer 101 is formed on the upper surface 100A of the substrate 100 by sputtering.

At the time of forming the underlying layer 101, the substrate 100 is not necessarily heated, but the substrate 100 is preferably heated. By heating the substrate 100 at the time of forming the underlying layer 101, crystals included in the underlying layer 101 are easily oriented to the c-axis, and thus the underlying layer 101 having an excellent crystal quality may be easily formed. In order to efficiently obtain the effects described above, the substrate 100 is heated to preferably 400° C. or less, and preferably 50° C. or more and 150° C. or less. If the substrate 100 is heated to 400° C. or less, in a case where the material of the target includes nitrogen atoms (for example, a case in which the target is made of AlN), an effect can be obtained that nitrogen atoms are inhibited from dissociating from the target.

Formation of Buffer Layer

In a process of forming the buffer layer 102, the buffer layer 102 is formed on the underlying layer 101 by, for example, metal organic chemical vapor deposition (MOCVD). Accordingly, it contributes to mass production of the buffer layer 102, and thus contributes to mass production of the nitride semiconductor light-emitting device.

For example, first, the substrate 100 in which the underlying layer 101 is formed is taken out from the sputtering apparatus, and provided in an MOCVD apparatus. As the MOCVD apparatus, an MOCVD apparatus which is generally used for producing the nitride semiconductor light-emitting device can be used without being particularly limited.

Next, a temperature of the substrate 100 is increased. The temperature of the substrate 100 may be increased under an atmosphere containing at least one of hydrogen, ammonia, and nitrogen. In a case where the underlying layer 101 includes nitrogen atoms (for example, a case in which the underlying layer 101 includes AlN crystals oriented to the c-axis), the temperature of the substrate 100 may be increased under an atmosphere including ammonia. With such process, even when the temperature of the substrate 100 exceeds 400° C., nitrogen atoms can be inhibited from being dissociated from the underlying layer 101.

Subsequently, in a state in which the temperature of the substrate 100 is maintained, growth of the nitride semiconductor single crystal is started. In a case of producing the nitride semiconductor light-emitting device generating deep ultraviolet, there are many cases of growing the nitride semiconductor single crystal including Al. Therefore, the nitride semiconductor single crystal may be grown in a state in which the temperature of the substrate 100 is maintained at a temperature of 1000° C. or more. In a case of producing the nitride semiconductor light-emitting device generating ultraviolet, there are many cases of growing the nitride semiconductor single crystal including Al. Therefore, the nitride semiconductor single crystal may be grown in a state in which the temperature of the substrate 100 is maintained at a temperature of 1200° C. or more. In a case of producing the nitride semiconductor light-emitting device generating visible light, there are many cases of growing the nitride semiconductor single crystal including In. Therefore, the nitride semiconductor single crystal may be grown in a state in which the temperature of the substrate 100 is maintained at a temperature of 700° C. or less.

Formation of Multilayer Structure

In a process of forming the multilayer structure, the n-type nitride semiconductor layer 103, the light-emitting layer 106, the carrier-barrier layer 107, and the p-type nitride semiconductor layer 108 are sequentially formed on the buffer layer 102. The multilayer structure may be formed by MOCVD. The multilayer structure may be formed using the MOCVD apparatus which is used for forming the buffer layer 102, and the multilayer structure may be formed using an MOCVD apparatus different from the MOCVD apparatus which is used for forming the buffer layer 102. In this way, the wafer is manufactured.

Formation of N-Side Electrode and P-Side Electrode

In a process of forming the n-side electrode 110 and the p-side electrode 111, the n-side electrode 110 is formed on the exposed surface of the n-type nitride semiconductor layer 103, and the p-side electrode 111 is formed on the upper surface of the p-type nitride semiconductor layer 108.

For example, first, after taking out the wafer from the MOCVD apparatus, the p-type impurity is activated. After that, the p-type nitride semiconductor layer 108, the carrier-barrier layer 107, the light-emitting layer 106, and the n-type nitride semiconductor layer 103 are etched by photolithography and reactive ion etching (RIE), and the exposed surface of the n-type nitride semiconductor layer 103 is formed. For example, the n-side electrode 110 is formed on the exposed surface of the n-type nitride semiconductor layer 103 by vacuum deposition.

In addition, for example, a mask is formed on a region different from a region where the p-side electrode 111 is formed on the upper surface of the p-type nitride semiconductor layer 108 by photolithography. After that, for example, the p-side electrode 111 is formed on a part where the mask is formed on the upper surface of the p-type nitride semiconductor layer 108 by vacuum deposition.

A heating process may be performed after forming the n-side electrode 110 and the p-side electrode 111. With such process, the n-side electrode 110 is sintered, and accordingly, the n-side electrode 110 and the n-type nitride semiconductor layer 103 are in ohmic contact. In addition, when the p-side electrode 111 is sintered, the p-side electrode 111 and the p-type nitride semiconductor layer 108 are in ohmic contact.

Dividing Wafer into Pieces

For example, the wafer is divided into chips by dicing, laser scribing, or the like. Therefore, the nitride semiconductor light-emitting device is produced. Preferably, the produced nitride semiconductor light-emitting device is mounted in a stem, and the nitride semiconductor light-emitting device and the stem are electrically connected with each other, then the nitride semiconductor light-emitting device is sealed with resin, or the like.

Second Embodiment

Figure 2:
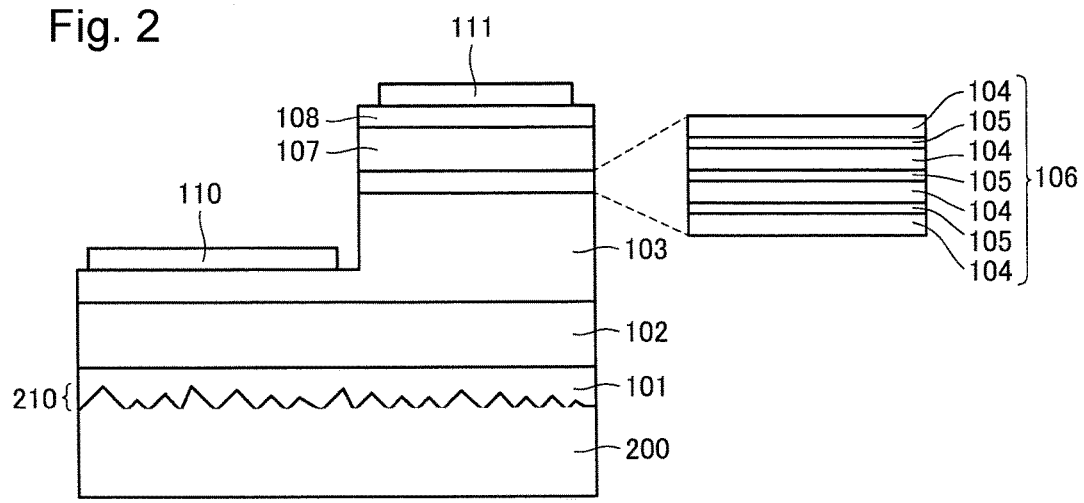
FIG. 2 is a sectional view of a nitride semiconductor light-emitting device of an embodiment of the disclosure.

FIG. 2 is a sectional view of a nitride semiconductor light-emitting device of a second embodiment of the disclosure. The nitride semiconductor light-emitting device of this embodiment includes a substrate 200 in which an unevenness 210 is formed on an upper surface thereof instead of the substrate 100 of the first embodiment. Hereinafter, differences from the first embodiment will be mainly described.

In this embodiment, since the unevenness 210 is formed on the upper surface of the substrate 200, the light generated in the light-emitting layer 106 is scattered in the upper surface of the substrate 200. Accordingly, even light incident at a predetermined incident angle (0°<incident angle<90°) of the unevenness 210 to the surface (the light generated in the light-emitting layer 106) is taken out from the nitride semiconductor light-emitting device, the light extraction efficiency of the nitride semiconductor light-emitting device can be further improved.

In a case where the underlying layer 101 is chemically formed on the upper surface of the substrate 200, in the upper surface of the substrate 200, a progress of chemical reaction, flow of reaction gas, or the like becomes nonuniform due to the unevenness 210. Therefore, a film forming process is not easily uniformly performed in the upper surface of the substrate 200, and in a film forming process, flatness, or the like of the upper surface of the substrate 200 is affected.

However, in this embodiment, in the same manner as in the first embodiment, the underlying layer 101 is formed on the upper surface of the substrate 200 by sputtering, and therefore, it is physically formed on the upper surface of the substrate 200. Therefore, the underlying layer 101 can be formed without being affected by the progress of the chemical reaction, flowing of the chemical reactive gas, or the like. Accordingly, even in a case where the unevenness 210 is formed on the upper surface of the substrate 200, the underlying layer 101 in which the crystal quality is uniform can be formed on the upper surface of the substrate 200, and thus the nitride semiconductor layer in which the crystal quality is uniform can be formed on the underlying layer 101. Therefore, when the unevenness 210 is formed on the upper surface of the substrate 200, improvement in the light extraction efficiency of the nitride semiconductor light-emitting device can be realized. Hitherto, compared to a case in which as the growth substrate for the nitride semiconductor layer the single crystal sapphire substrate is used, the nitride semiconductor light-emitting device in which the element characteristics (for example, the light extraction efficiency) is further improved can be provided at low costs.

In the unevenness 210, shapes of concave portions or convex portions, sizes of the concave portions or the convex portions, the number of the concave portions or the convex portions, gaps of the concave portions or the convex portions, and the like are not particularly limited. In addition, regarding adjacent concave portions, shapes or sizes of the concave portions may be the same as each other or may be different from each other. This equally works on adjacent convex portions. Further, gaps of the concave portions in the upper surface of the substrate 200 may be equal to each other, or may be different from each other. This equally works on gaps of the convex portions in the upper surface of the substrate 200. For example, shapes of the concave portions or the convex portions may be cone or pyramid, and depths of the concave portions or heights of the convex portions are preferably 50 nm or more and 500 nm or less, and gaps of the adjacent concave portions or the adjacent convex portions are preferably 50 µm or more and 200 µm or less.

A forming method of the unevenness 210 is not particularly limited. In a case where an unevenness process is performed on a single crystal sapphire substrate, a high power excimer laser light, or the like is demanded to be applied to the single crystal sapphire substrate. Therefore, there is a difficulty in the unevenness process with respect to the single crystal sapphire substrate. However, the substrate 200 includes polycrystal silicon dioxide or including amorphous silicon dioxide as a main component, the unevenness process can be performed on the substrate 200 by etching using sandblasting or etchant including hydrofluoric acid. Accordingly, rather than the unevenness process with respect to the single crystal sapphire substrate, the unevenness process with respect to the substrate 200 can be easily performed at low costs. Therefore, compared to a case in which the single crystal sapphire substrate is used as the growth substrate for the nitride semiconductor layer, the nitride semiconductor light-emitting device in which the element characteristics (for example, the light extraction efficiency) is further improved can be provided at low costs.

As a condition of sandblasting, a general condition can be used as a condition of sandblasting at the time of forming unevenness on the surface of the substrate without being particularly limited. If a size of particles of polishing agent used for sandblasting, time taking for ejecting the particles of polishing agent onto the upper surface of the substrate 200, or the like is changed, shapes or sizes of the unevenness 210 is changed.

In addition, as a condition of wet etching using etchant including hydrofluoric acid, a general condition as a condition of wet etching at the time of forming unevenness on the surface of the can be used without being particularly limited. If time for immersing the upper surface of the substrate 200 in etchant, or the like is changed, shapes or sizes of the unevenness 210 are changed.

Third Embodiment

Figure 3:
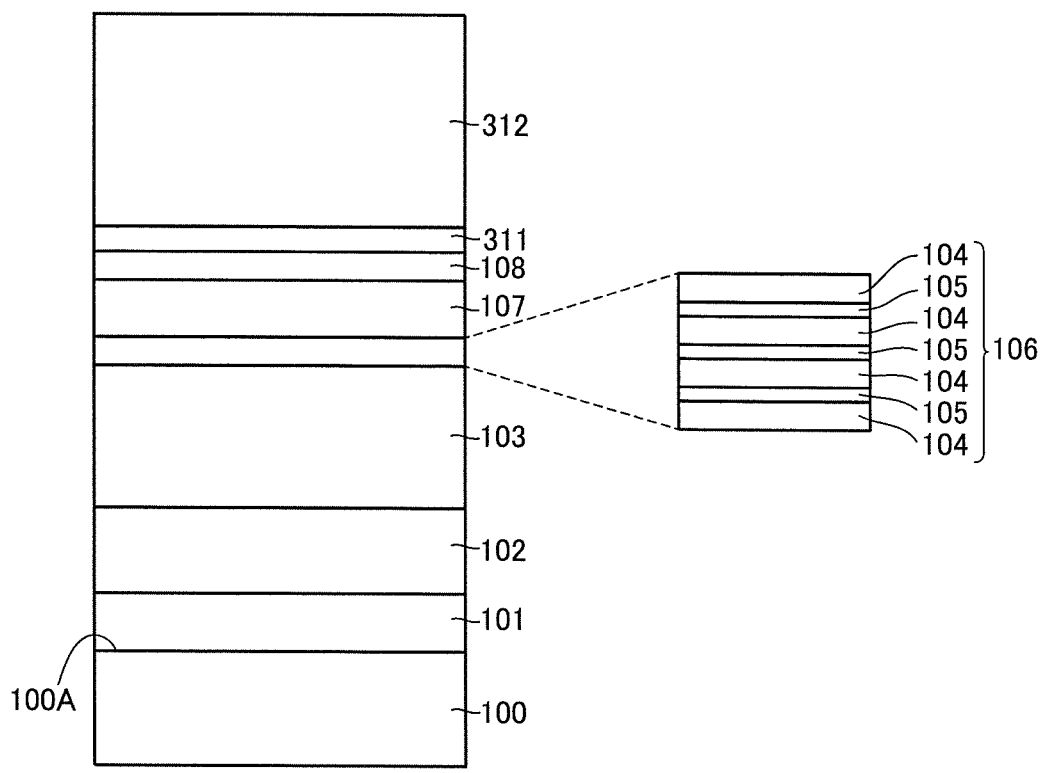
FIG. 3 is a sectional view of a process for producing a nitride semiconductor light-emitting device of an embodiment of the disclosure.
Figure 4:
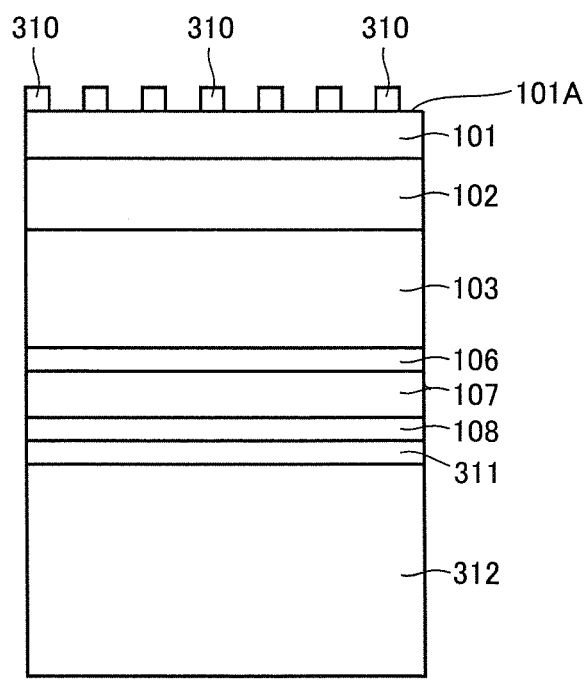
FIG. 4 is a sectional view of a nitride semiconductor light-emitting device of an embodiment of the disclosure.

FIG. 3 is a sectional view illustrating a process for producing the nitride semiconductor light-emitting device of a third embodiment of the disclosure. FIG. 4 is a sectional view illustrating the nitride semiconductor light-emitting device of this embodiment. In this embodiment, the substrate 100 is removed after forming the multilayer structure. Therefore, the produced nitride semiconductor light-emitting device does not include the substrate 100 (FIG. 4). Hereinafter, difference of the third embodiment from the first embodiment will be mainly described.

Producing Nitride Semiconductor Light-Emitting Device
Formation of Multilayer Structure and P-Side Electrode First, after a wafer is formed by the method described in the first embodiment described above, the p-type impurity is activated. According to the method described in the first embodiment described above, a p-side electrode 311 is formed on the upper surface of the p-type nitride semiconductor layer 108 without etching the multilayer structure, for example. After that, a supporting base body 312 is bonded to the upper surface of the p-side electrode 311. Accordingly, a multilayer body illustrated in FIG. 3 is formed.

The supporting base body 312 preferably has conductivity. With conductivity, electric resistance generated at the time of applying a voltage to the nitride semiconductor light-emitting device can be reduced.

More preferably, the supporting base body 312 is made of a material having a thermal expansion coefficient same as that of the nitride semiconductor constituting the nitride semiconductor layer included in the multilayer structure. With such material being used, cracks, which are caused by a thermal expansion coefficient difference between a material of the supporting base body 312 and a material of the nitride semiconductor layer included in the multilayer structure, can be inhibited from being generated. As such a material, for example, tungsten is exemplified.

Adhesive for bonding the supporting base body 312 to the upper surface of the p-side electrode 311 may include conductivity. Accordingly, electric resistance generated at the time of applying a voltage to the nitride semiconductor light-emitting device can be reduced. As such adhesive, adhesive (for example, adhesive having thermosetting properties), which is generally used for bonding an integrated circuit to a mounting substrate, or the like, may be used, or adhesive having a low melting point (for example, solder) may be used.

Removal of Substrate

Next, the multilayer body illustrated in FIG. 3 is immersing in the etchant including hydrofluoric acid. Accordingly, the substrate 100 is selectively removed. Depending on the size of the substrate 100, time for immersing the multilayer body illustrated in FIG. 3 in the etchant may be changed.

Formation of N-Side Electrode

Subsequently, the n-side electrodes 310 are formed on the surface 101A (it is a "surface of the underlying layer 101 positioned on an opposite side of the multilayer structure", hereinafter, referred to as a "the exposed surface of underlying layer") of the underlying layer 101, which is exposed because the substrate 100 is removed. The n-side electrodes 310 are preferably formed in a stripe shape on the exposed surface 101A of the underlying layer 101, and more preferably, the n-side electrodes 310 are formed in a matrix shape on the exposed surface 101A of the underlying layer 101. As described above, the nitride semiconductor light-emitting device of this embodiment is produced (FIG. 4).

Configuration of Nitride Semiconductor Light-Emitting Device

In the nitride semiconductor light-emitting device produced as described above, as illustrated in FIG. 4, the underlying layer 101, the buffer layer 102, the n-type nitride semiconductor layer 103, the light-emitting layer 106, the carrier-barrier layer 107, and the p-type nitride semiconductor layer 108 are sequentially provided. The n-side electrodes 310 are provided in a stripe shape or a matrix shape on the exposed surface 101A of the underlying layer 101, and the p-side electrode 311 is provided on a lower surface of the p-type nitride semiconductor layer 108.

In the nitride semiconductor light-emitting device of this embodiment, the n-side electrodes 310 are provided the upper surface side of the element, and the p-side electrode 311 is provided the lower surface side of the element. Accordingly, in the nitride semiconductor light-emitting device of this embodiment, current flowing between the n-side electrode 310 and the p-side electrode 311 becomes vertically flow with respect to the light-emitting layer 106. That is, the nitride semiconductor light-emitting device of this embodiment is a so-called the nitride semiconductor light-emitting device having a vertical structure.

Here, in the nitride semiconductor light-emitting device, the nitride semiconductor light-emitting device having the vertical structure and the nitride semiconductor light-emitting device having the horizontal structure are present. In the nitride semiconductor light-emitting device having the horizontal structure, current flowing between the n-side electrode and the p-side electrode flows in parallel to the light-emitting layer (refer to FIG. 1 or FIG. 2). Therefore, in the nitride semiconductor light-emitting device having the horizontal structure, compared to the nitride semiconductor light-emitting device having the vertical structure, a light-emitting area in the light-emitting layer 106 becomes smaller, and thus a light extraction amount per unit size of the nitride semiconductor light-emitting device is reduced. In addition, electric resistance, which is generated at the time of flowing current inside the nitride semiconductor light-emitting device, is increased. Accordingly, if element structures in the nitride semiconductor light-emitting device having the vertical structure and the nitride semiconductor light-emitting device having the horizontal structure are totally same as each other, the nitride semiconductor light-emitting device having the vertical structure shows the element characteristics more excellent than the nitride semiconductor light-emitting device having the horizontal structure. In this way, the nitride semiconductor light-emitting device having the vertical structure having the element characteristics more excellent than the nitride semiconductor light-emitting device having the horizontal structure may be provided.

However, in order to produce the nitride semiconductor light-emitting device having the vertical structure, the growth substrate for the nitride semiconductor layer is demanded to be removed in a produce process thereof. In a case where the single crystal sapphire substrate is used as the growth substrate for the nitride semiconductor layer, the single crystal sapphire substrate is removed by applying a high power excimer laser light, or the like onto the single crystal sapphire substrate. Therefore, removing the growth substrate for the nitride semiconductor layer is not easy, such that the nitride semiconductor light-emitting device having the vertical structure is not easily provided at low costs.

Meanwhile, in a case where the substrate 100 is used as the growth substrate for the nitride semiconductor layer, the substrate 100 can be removed by immersing the multilayer body as illustrated in FIG. 3 in the etchant. Because, polycrystal silicon dioxide or amorphous silicon dioxide which is a main component of the substrate 100 is dissolved by hydrofluoric acid. Accordingly, since the substrate 100 can be removed without difficulty, the nitride semiconductor light-emitting device having the vertical structure can be easily provided at low costs. Hitherto, In this embodiment, compared to a case in which the single crystal sapphire substrate is used as the growth substrate for the nitride semiconductor layer, the nitride semiconductor light-emitting device, in which the element characteristics (for example, the light extraction efficiency) is further improved, can be further provided at low costs.

Besides, since the p-side electrode 311 is consisted of a metal as described in the first embodiment, the p-side electrode 311 functions as a reflecting layer for reflecting the light generated in the light-emitting layer 106 to the n-side electrode 310 side. Accordingly, most light generated in the light-emitting layer 106 are disassociated from the n-side electrode 310 side to the outside of the nitride semiconductor light-emitting device. Therefore, if the n-side electrodes 310 are provided in a stripe shape on the exposed surface 101A of the underlying layer 101, the light generated in the light-emitting layer 106 is preferentially disassociated from a part in the exposed surface 101A of the underlying layer 101, where the n-side electrodes 310 are not provided, to the outside of the nitride semiconductor light-emitting device. Accordingly, compared to a case in which the n-side electrodes 310 are provided on the entirety of the exposed surface 101A of the underlying layer 101, an amount of light (the light generated in the light-emitting layer 106) is shielded by the n-side electrodes 310 can be suppressed to be small. Therefore, in this embodiment, if the n-side electrodes 310 are provided in a stripe shape on the exposed surface 101A of the underlying layer 101, compared to a case in which the single crystal sapphire substrate is used as the growth substrate for the nitride semiconductor layer, the nitride semiconductor light-emitting device in which the element characteristics (for example, the light extraction efficiency) is further improved can be further provided at low costs.

If the n-side electrodes 310 are provided in a matrix shape on the exposed surface 101A of the underlying layer 101, an amount of light (the light generated in the light-emitting layer 106) is shielded by the n-side electrodes 310 can be suppressed to be small. Accordingly, in this embodiment, If the n-side electrodes 310 are provided in a matrix shape on the exposed surface 101A of the underlying layer 101, compared to a case in which the single crystal sapphire substrate is used as the growth substrate for the nitride semiconductor layer, the nitride semiconductor light-emitting device in which the element characteristics (for example, the light extraction efficiency) is further improved can be further provided at low costs.

The sizes or shapes of the n-side electrodes 310, gaps of adjacent n-side electrodes 310 are not particularly limited. For example, the n-side electrode 310 may be provided on the exposed surface 101A of the underlying layer 101, so that an exposing ratio (=an area of a part where the n-side electrode 310 is not coated in the exposed surface 101A of the underlying layer 101/an area of the exposed surface 101A of the underlying layer 101) of the exposed surface 101A of the underlying layer 101 is 5% or more and 20% or less.

Timing of removing the substrate 100 is not limited to timing illustrated in this embodiment. After the nitride semiconductor layer constituting the multilayer structure is formed one layer or more, the substrate 100 may be removed.

In addition, in this embodiment, the substrate 200 may be used as the growth substrate for the nitride semiconductor layer, in addition to the substrate 100. However, the upper surface of the substrate 100 is more flat than the upper surface of the substrate 200. Therefore, when the substrate 100 is used as the growth substrate for the nitride semiconductor layer, the substrate 100 can be easily removed, and thus the nitride semiconductor light-emitting device having excellent exterior can be produced. Further, lacking, or the like of the underlying layer 101 at the time of producing or using the nitride semiconductor light-emitting device can be inhibited.

Summary of Embodiments

The nitride semiconductor light-emitting device as illustrated in FIG. 1 or FIG. 2 includes the substrate 100 or 200 including polycrystal silicon dioxide or amorphous silicon dioxide as a main component, the underlying layer 101 provided on the substrate 100 or 200, and the multilayer structure which is provided on the underlying layer 101 and includes at least one layer made of a nitride semiconductor single crystal. The underlying layer 101 includes the crystals oriented to the c-axis, and is formed by sputtering. Accordingly, compared to a case in which the single crystal sapphire substrate is used as the growth substrate for the nitride semiconductor layer, the nitride semiconductor light-emitting device in which current element characteristics are maintained or higher than those can be provided at low costs.

The nitride semiconductor light-emitting device as illustrated in FIG. 1 or FIG. 2 includes substrates 100 and 200 including polycrystal silicon dioxide or amorphous silicon dioxide as a main component, the underlying layer 101 provided on the substrates 100 and 200, and the multilayer structure which is provided on the underlying layer 101 and includes at least one layer made of a nitride semiconductor single crystal. The underlying layer 101 includes the crystals oriented to the c-axis, and includes 10 atom % of rare gas atoms or less. As described above, compared to a case in which the single crystal sapphire substrate is used as the growth substrate for the nitride semiconductor layer, the nitride semiconductor light-emitting device in which current element characteristics are maintained or higher than those can be provided at low costs.

The underlying layer 101 may include at least one of AlN crystals oriented to the c-axis, BN crystals oriented to the c-axis, and $Ga_2O_3$ crystal oriented to the c-axis, as the crystals oriented to the c-axis.

The underlying layer 101 may further include 10 atom % or less of oxygen atoms separately from the crystals oriented to the c-axis. Accordingly, c-axis orientation of the crystals included in the underlying layer 101 can be improved.

The unevenness 210 may be formed on a surface of the substrate 200 positioned on the underlying layer 101 side. Accordingly, the light extraction efficiency of the nitride semiconductor light-emitting device can be improved.

The substrates 100 and 200 may further include the first atoms different from silicon atoms and oxygen atoms. The first atoms make refractive indices of the substrates 100 and 200 higher than a refractive index of the substrate made of only silicon dioxide by being included in the substrates 100 and 200. Accordingly, the light extraction efficiency of the nitride semiconductor light-emitting device can be improved. The first atoms are at least one of, for example, lanthanum atoms and titanium atoms.

The substrates 100 and 200 may include $1\times10^{10}$ $cm^{-3}$ or more and $1\times10^{12}$ $cm^{-3}$ or less of the first atoms. Accordingly, an effect of inhibiting the light generated in the light-emitting layer 106 from being absorbed in the first atoms can be obtained.

As illustrated in FIG. 3, the p-side electrode 311 may be provided on the multilayer structure, and the n-side electrodes 310 may be provided under the underlying layer 101 instead of the substrates 100 and 200. Accordingly, the nitride semiconductor light-emitting device having the vertical structure can be provided.

The method for producing the nitride semiconductor light-emitting device as illustrated in FIG. 1 to FIG. 3, includes a process for forming the underlying layer 101 including the crystals oriented to the c-axis is formed on the substrates 100 and 200 including polycrystal silicon dioxide or amorphous silicon dioxide as a main component by sputtering, and a process for forming the multilayer structure including at least one layer made of a nitride semiconductor single crystal on the underlying layer 101. Accordingly, compared to a case in which the single crystal sapphire substrate is used as the growth substrate for the nitride semiconductor layer, the nitride semiconductor light-emitting device in which current element characteristics are maintained or higher than those can be provided at low costs.

The method for producing the nitride semiconductor light-emitting device as illustrated in FIG. 2 may further include a process for forming the unevenness 210 on the surface of the substrate 200 positioned on the underlying layer 101 side. Accordingly, the nitride semiconductor light-emitting device in which the light extraction efficiency is improved can be produced. The unevenness may be formed by sandblasting, or the unevenness may be formed by wet etching using etchant including hydrofluoric acid.

The method for producing the nitride semiconductor light-emitting device illustrated in FIG. 3 may further include a process of removing the substrates 100 and 200 after at least one layer made of a nitride semiconductor single crystal is formed, a process of forming the p-side electrode 311 on the multilayer structure, and a process of forming the n-side electrodes 310 on the surface of the underlying layer 101 which is exposed by removing the substrates 100 and 200. Accordingly, the nitride semiconductor light-emitting device having the vertical structure can be produced.

EXAMPLES

Hereinafter, the disclosure will be described in detail with respect to examples. The disclosure is not limited to the examples.

Example 1

In Example 1, the nitride semiconductor light-emitting device is produced in accordance with the method described in the first embodiment. First, as the growth substrate for the nitride semiconductor layer, the substrate made of polycrystal silicon dioxide (diameter: substantially 4 inches (100 mm), thickness: 900 μm) is prepared. The substrate is cleaned with pure water after being cleaned with acetone and isopropyl alcohol (organic solvent).

Next, the cleaned substrate is provided at a predetermined position in the sputtering apparatus, and a target made of polycrystal AlN is provided at a predetermined position in the sputtering apparatus. After vacuuming the inside of the sputtering apparatus, argon (inert gas) is introduced into the sputtering apparatus. A temperature of the substrate is increased up to 100° C., and a high frequency voltage is supplied (voltage: 300 V, frequency: 13.56 MHz) between the substrate and the target in a state in which the temperature of the substrate is maintained at 100° C. As a result, an AlN layer (underlying layer, thickness: 500 nm) is formed on the upper surface of the substrate. The inventors confirm that the formed underlying layer includes 9 atom % of argon atoms.

Subsequently, the substrate in which the underlying layer is formed is taken out from the sputtering apparatus and is provided at a predetermined position inside an MOCVD apparatus. In a state in which ammonia is supplied to the MOCVD apparatus, the temperature of the substrate is increased up to 1050° C. In a state in which the temperature of the substrate is maintained at 1050° C., trimethylaluminium (TMA) is supplied to the MOCVD apparatus. Thus, the AlN layer (buffer layer, thickness: 4 μm) is formed on the upper surface of the underlying layer.

Subsequently, trimethylgallium (TMG) and $SiH_4$ are supplied to the MOCVD apparatus. Thus, an n-type $Al_{0.7}Ga_{0.3}N$ layer (thickness: substantially 2 μm, concentration of n-type impurity: $8\times10^{18}$ $cm^{-3}$) is formed on the upper surface of the buffer layer.

Subsequently, when supplying $SiH_4$ to the MOCVD apparatus is stopped and a supplying amount of TMG to the MOCVD apparatus is controlled, the light-emitting layer is formed. Specifically, after the barrier layer (thickness: 2 nm) made of $Al_{0.6}Ga_{0.4}N$ and the well layer (thickness: 3 nm) made of $Al_{0.4}Ga_{0.6}N$ are formed alternately in three layers on the n-type $Al_{0.7}Ga_{0.3}N$ layer, an $Al_{0.6}Ga_{0.4}N$ barrier layer is formed on the well layer which is positioned on top.

Subsequently, a supplying amount of TMG to the MOCVD apparatus is reduced, and $CP_2Mg$ (Bis methylcyclopentadienyl magnesium) is further supplied to the MOCVD apparatus. Thus, a carrier-barrier layer (thickness: 10 nm) made of $Al_{0.7}Ga_{0.3}N$ is formed on the $Al_{0.6}Ga_{0.4}N$ barrier layer.

Subsequently, the supplying amount of TMG to the MOCVD apparatus is increased, and a p-type AlGaN layer (thickness: 50 nm, concentration of p-type impurity: $2\times10^{18}$ $cm^{-3}$) is formed on the carrier-barrier layer. After that, a supplying amount of $CP_2Mg$ to the MOCVD apparatus is increased, and a $p^+$-type AlGaN layer (thickness: 10 nm, concentration of p-type impurity:$7\times10^{18}$ cm$^{-3}$) is formed on the p-type AlGaN layer. After the obtained wafer is cooled under an atmosphere including ammonia at a room temperature, the wafer is taken out from the MOCVD apparatus.

The wafer taken out from the MOCVD apparatus is heated under a nitrogen atmosphere, at substantially 900° C. The wafer is etched by a photolithography and RIE, and a part of the n-type $Al_{0.7}Ga_{0.3}N$ layer is exposed. After that, the n-side electrode made of Ni/Au is formed on the exposed surface of the n-type $Al_{0.7}Ga_{0.3}N$ layer by vacuum deposition.

In addition, a mask is formed on a part of the upper surface of the $p^+$-type AlGaN layer by a photolithography. After that, the p-side electrode made of Pd/Au is formed on a part where the mask is exposed in the upper surface of the $p^+$-type AlGaN layer by vacuum deposition.

After forming the n-side electrode and the p-side electrode, these are heated at 900° C. After that, the wafer is divided into chips by dicing. The obtained chips are mounted in a stem, and then the n-side electrode of the chip and the n-side electrode of the stem are electrically connected to each other, and the p-side electrode of the chip and the p-side electrode of the stem are electrically connected to each other. After that, the chips are sealed with resin. As a result, the nitride semiconductor light-emitting device of the example can be obtained.

A voltage is applied to the obtained nitride semiconductor light-emitting device, and thus the element characteristics is evaluated and, as a result, internal quantum efficiency is substantially 40%, and the light extraction efficiency is 10%.

In addition, a half-value width of the X-ray rocking curve of a plane (0002) of the underlying layer and a half-value width of the X-ray rocking curve of a plane (1-102) of the underlying layer are obtained by applying X-ray to the upper surface of the $p^+$-type AlGaN layer of the wafer taken out from the MOCVD apparatus and, as a result, the half-value width of the X-ray rocking curve of the plane (0002) of the underlying layer is 100 seconds or less and the half-value width of the X-ray rocking curve of the plane (1-102) of the underlying layer is 200 seconds or less. From this result, it is found that the underlying layer having a crystal quality which is the same as a case in which the single crystal sapphire substrate is used as the growth substrate for the nitride semiconductor layer.

In addition, orientation of the AlN crystals (AlN crystals included in underlying layer) is investigated by a convergent beam electron diffraction (CBED) and, as a result, it is found that the AlN crystals has an excellent c-axis orientation.

Further, orientation of the AlN crystals included in the underlying layer of the wafer taken out from the MOCVD apparatus and orientation of the AlN crystals included in the underlying layer in a state before the buffer layer is formed on the underlying layer are investigated by the convergent beam electron diffraction. As a result, it is found that the AlN crystals included in the underlying layer has an excellent c-axis orientation in any cases. As a result, the AlN crystals included in the underlying layer is shown to has an excellent c-axis orientation at a time of being grown on the upper surface of the substrate, it is apparent that an excellent c-axis orientation is not recognized by heating, or the like, after the multilayer structure, or the like is formed. This resultant will be described in Examples 2 to 7 as below.

The inventors have confirmed that, even in a case where the substrate made of amorphous silicon dioxide is used instead of the substrate made of polycrystal silicon dioxide, an effect same as that of the example can be obtained.

Comparative Example 1

The underlying layer is formed by MOCVD. Other than that, a nitride semiconductor light-emitting device of the comparative example is produced by the method described in Example 1.

The half-value width of the X-ray rocking curve of the plane (0002) of the underlying layer and the half-value width of the X-ray rocking curve of the plane (1-102) of the underlying layer are obtained by the method described in Example 1 and, as a result, both of the half-value width of the X-ray rocking curve of the plane (0002) of the underlying layer and the half-value width of the X-ray rocking curve of the plane (1-102) of the underlying layer exceed 2000 seconds. From this result, it is found that, if the underlying layer is formed on the upper surface of the substrate made of polycrystal silicon dioxide by MOCVD, the crystal quality of the underlying layer is deteriorated.

Example 2

In Example 2, the nitride semiconductor light-emitting device is produced by a method described in a second embodiment. First, the unevenness is formed on the upper surface of the substrate (a surface where the underlying layer is formed in the surface of the substrate) prepared in Example 1 by sandblasting. A depth (or height of convex portion) of the concave portion is measured using a step meter and, as a result, the average value thereof is substantially 500 nm. After that, the nitride semiconductor light-emitting device of the example is produced by the method described in Example 1.

A voltage is applied to the nitride semiconductor light-emitting device in order to evaluate the element characteristics of the nitride semiconductor light-emitting device of the example by the method described in Example 1 and, as a result, the upper surface of the substrate is cloudy. From this effect, it is found that light generated in the light-emitting layer is scattered in the upper surface of the substrate. Actually, internal quantum efficiency is substantially 40% (same as in Example 1); however, the light extraction efficiency is 25% (more improved than Example 1). From this result, if the unevenness is formed on the upper surface of the substrate, it is found that the light extraction efficiency of the nitride semiconductor light-emitting device is further improved.

In addition, by the convergent beam electron diffraction method, orientation of the AlN crystals (AlN crystals included in the underlying layer) is investigated and, as a result, it is found that the c-axis orientation of the AlN crystals of the example has no great difference from that of Example 1 example. From this result, even when the unevenness is formed on the upper surface of the substrate, if the underlying layer is formed on the upper surface of the substrate by sputtering, it is found that the underlying layer having an excellent crystal quality can be formed.

Example 3

In Example 3, a nitride semiconductor light-emitting device is produced by a method described in Example 3. First, the underlying layer, the buffer layer, the n-type $Al_{0.7}Ga_{0.3}N$ layer, the light-emitting layer, the carrier-barrier layer, the p-type AlGaN layer, and the $p^+$-type AlGaN layer are sequentially provided on the upper surface of the substrate by the method described in Example 1, and then heating is performed thereon. The p-side electrode is formed by the method described in Example 1 without etching the multilayer body after heating.

Next, a supporting base body made of tungsten (W) is bonded to the upper surface of the p-side electrode using conductivity adhesive having conductivity. After that, the obtained multilayer body is cleaned using etchant including hydrofluoric acid. Accordingly, the substrate is removed.

Subsequently, the n-side electrode is formed in a matrix shape on the surface of the underlying layer (exposed surface of underlying layer) which is exposed by removing the substrate. After that, the nitride semiconductor light-emitting device (nitride semiconductor light-emitting device having vertical structure) of the example is obtained by the method described in Example 1.

The element characteristics of the nitride semiconductor light-emitting device of the example are evaluated by the method described in Example 1 and, as a result, internal quantum efficiency thereof is substantially 40% (same as that of Example 1), and light extraction efficiency is 35% (improved more than Example 1 and example 2). From this result, it is found that the extraction efficiency of in the nitride semiconductor light-emitting device having the vertical structure light is further improved, compared to the nitride semiconductor light-emitting device having the horizontal structure.

Example 4

In Example 4, except a substrate including $5 \times 10^{11}$ cm$^{-3}$ of La atoms, the nitride semiconductor light-emitting device is produced by the method described in Example 1.

The element characteristics of the nitride semiconductor light-emitting device of the example are evaluated by the method described in Example 1 and, as a result, the internal quantum efficiency is substantially 40% (same as that of Example 1), and the light extraction efficiency is 23% (improved more than that of Example 1). From this result, if the substrate including $5 \times 10^{11}$ cm$^{-3}$ of La atoms is used as the growth substrate for the nitride semiconductor layer, it is found that the light extraction efficiency of the nitride semiconductor light-emitting device is further improved.

The inventors have confirmed that an effect same as that of the example can be obtained in a case where a substrate including $1 \times 10^{11}$ cm$^{-3}$ of Ti atoms is used instead of the substrate including $5 \times 10^{11}$ cm$^{-3}$ of La atoms.

Example 5

In Example 5, except that the unevenness is formed on the upper surface of the substrate of Example 4 by the method described in Example 2, the nitride semiconductor light-emitting device is produced by the method described in Example 1.

The element characteristics of the nitride semiconductor light-emitting device of the example are evaluated by the method described in Example 1 and, as a result, the internal quantum efficiency is substantially 40% (same as that of Example 1), and the light extraction efficiency is 28% (improved more than that of Example 4). From this result, in the substrate including $5 \times 10^{11}$ cm$^{-3}$ of La atoms, if a substrate in which the unevenness is formed on the upper surface is used as the growth substrate for the nitride semiconductor layer, it is found that the light extraction efficiency of the nitride semiconductor light-emitting device is further improved.

Example 6

In Example 6, except that the underlying layer is formed using a target made of polycrystal BN, the nitride semiconductor light-emitting device is produced by the method described in Example 1. The element characteristics of the nitride semiconductor light-emitting device of the example are evaluated by the method described in Example 1 and, as a result, an effect same as that of Example 1 can be obtained with the internal quantum efficiency and the light extraction efficiency.

The inventors have confirmed that an effect same as that of the example can be obtained, even in a case where a target made of polycrystal $Ga_2O_3$ is used instead of the target made of polycrystal BN.

Example 7

In Example 7, in the target made of polycrystal AlN, except that the underlying layer is formed using a target including 10 atom % of oxygen atoms, the nitride semiconductor light-emitting device is produced by the method described in Example 1. The element characteristics of the nitride semiconductor light-emitting device of the example are evaluated by the method described in Example 1 and, as a result, an effect same as that of Example 1 can be obtained with the internal quantum efficiency and the light extraction efficiency.

In addition, before forming the buffer layer, a composition of the underlying layer is investigated by SIMS and, as a result, it is found that a composition of the underlying layer is the same as the composition of the target. From this result, if a target made of a desired composition is used and the composition of the target is not changed while forming the underlying layer, it is found that the buffer layer made of a composition same as the composition of the target can be formed.

The inventors have confirmed that an effect same as that of the example can be obtained, even in a case where the target including 10 atom % of oxygen atoms which is the target made of polycrystal BN or the target including 10 atom % of oxygen atoms which is the target made of the polycrystal $Ga_2O_3$ are used, instead of the target including 10 atom % of oxygen atoms which is the target made of polycrystal AlN.

Comparative Example 2

In Comparative example 2, except that the underlying layer is formed using a target including 15 atom % of oxygen atoms in the target made of polycrystal AlN, the nitride semiconductor light-emitting device is produced by a method described in Example 7.

The element characteristics of the nitride semiconductor light-emitting device of the example are evaluated by the method described in Example 1 and, as a result, the internal quantum efficiency is approximately half of the nitride semiconductor light-emitting device of Example 7.

The half-value width of the X-ray rocking curve of the plane (0002) of the underlying layer and the half-value width of the X-ray rocking curve of the plane (1-102) of the underlying layer are calculated by the method described in Example 1 and, as a result, the half-value width of the X-ray rocking curve of the plane (0002) of the underlying layer is wider 1.5 times or more than that of Example 7. From this result, it is found that crystals included in the underlying layer have a distribution of c-axis orientation in a plane of the underlying layer. That is, it is found that crystals included in the underlying layer have not excellent c-axis orientation. Actually, a surface of the p⁺-type AlGaN layer is observed before forming the p-side electrode and, as a result, it is found that multiple hexagonal pyramid shape cracks are formed on the surface of the p⁺-type AlGaN layer.

The above description will be described hereinafter. In Comparative example, since the c-axis orientation of the crystals included in the underlying layer is not excellent, threading dislocation is formed on the nitride semiconductor layer (for example, light-emitting layer) formed on such an underlying layer at a high density. As a result, non-emitting recombination occurs, accordingly, it causes a large-scale deterioration of the internal quantum efficiency.

Embodiments and examples disclosed herein are examples in all respects and the disclosure can be considered not to be limited thereto. A range of the disclosure is described by claims in addition to the description above, and equivalent meanings of claims and all modifications within the range are intended to be included.

The present disclosure contains subject matter related to that disclosed in Japanese Priority Patent Application JP 2015-102912 filed in the Japan Patent Office on May 20, 2015, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A nitride semiconductor light-emitting device comprising:
   a substrate including polycrystal silicon dioxide or amorphous silicon dioxide as a main component;
   an underlying layer on the substrate; and
   a multilayer structure on the underlying layer and including at least one layer made of a nitride semiconductor single crystal,
   wherein the underlying layer includes crystals oriented to a c-axis and is formed by sputtering, and
   wherein the underlying layer includes 3 atom % or more and 10 atom % or less of oxygen atoms separately from the crystals oriented to the c-axis.

2. The nitride semiconductor light-emitting device according to claim 1,
   wherein the underlying layer includes at least one of AlN crystals oriented to the c-axis, BN crystals oriented to the c-axis, and $Ga_2O_3$ crystals oriented to the c-axis, as the crystals oriented to the c-axis.

3. The nitride semiconductor light-emitting device according to claim 1,
   wherein an unevenness is formed on a surface of the substrate, the surface facing the underlying layer.

4. The nitride semiconductor light-emitting device according to claim 1,
   wherein the substrate further includes first atoms which are different from silicon atoms and oxygen atoms and
   wherein the first atoms included in the substrate causes a refractive index of the substrate to be higher than a refractive index of a substrate including silicon dioxide alone.

5. The nitride semiconductor light-emitting device according to claim 4,
   wherein the first atoms are one or both of lanthanum atoms and titanium atoms.

6. The nitride semiconductor light-emitting device according to claim 4,
   wherein the substrate includes the first atoms of $1\times10^{10}$ $cm^{-3}$ or more and $1\times10^{12}$ $cm^{-3}$ or less.

7. The nitride semiconductor light-emitting device according to claim 1,
   wherein a p-side electrode is provided on the multilayer structure, and
   wherein n-side electrodes are provided under the underlying layer instead of the substrate.

8. A nitride semiconductor light-emitting device comprising:
   a substrate including polycrystal silicon dioxide or amorphous silicon dioxide as a main component;
   an underlying layer on the substrate; and
   a multilayer structure on the underlying layer and including at least one layer made of a nitride semiconductor single crystal,
   wherein the underlying layer includes crystals oriented to a c-axis and includes rare gas atoms of 10 atom % or less, and
   wherein the underlying layer includes 3 atom % or more and 10 atom % or less of oxygen atoms separately from the crystals oriented to the c-axis.

9. A method for producing a nitride semiconductor light-emitting device comprising:
   forming an underlying layer including crystals oriented to a c-axis on a substrate including polycrystal silicon dioxide or amorphous silicon dioxide as a main component by sputtering; and
   forming a multilayer structure, which includes at least one layer made of a nitride semiconductor single crystal, on the underlying layer,
   wherein the underlying layer includes 3 atom % or more and 10 atom % or less of oxygen atoms separately from the crystals oriented to the c-axis.

10. The method for producing a nitride semiconductor light-emitting device according to claim 9, further comprising:
    forming an unevenness on a surface of the substrate, the surface facing the underlying layer.

11. The method for producing a nitride semiconductor light-emitting device according to claim 10,
    wherein the unevenness is formed by sandblasting.

12. The method for producing a nitride semiconductor light-emitting device according to claim 10,
    wherein the unevenness is formed by wet etching using an etchant including hydrofluoric acid.

13. The method for producing a nitride semiconductor light-emitting device according to claim 9, further comprising:
    removing the substrate after at least one layer made of a nitride semiconductor single crystal is formed;
    forming a p-side electrode on the multilayer structure; and
    forming n-side electrodes on a surface of the underlying layer exposed by removing the substrate.

14. The method for producing a nitride semiconductor light-emitting device according to claim 9,
    wherein the substrate further includes first atoms which are different from silicon atoms and oxygen atoms and wherein the first atoms included in the substrate causes a refractive index of the substrate to be higher than a refractive index of a substrate including silicon dioxide alone.

15. The method for producing a nitride semiconductor light-emitting device according to claim 14,
wherein the first atoms are one or both of lanthanum atoms and titanium atoms.

16. The method for producing a nitride semiconductor light-emitting device according to claim 14,
wherein the substrate includes the first atoms of $1 \times 10^{10}$ cm$^{-3}$ or more and $1 \times 10^{12}$ cm$^{-3}$ or less.

* * * * *